United States Patent
Nagano et al.

(10) Patent No.: US 8,288,019 B2
(45) Date of Patent: Oct. 16, 2012

(54) SURFACE COATING FILM, METHOD OF MANUFACTURING THEREOF, CUTTING TOOL AND MACHINE TOOL

(75) Inventors: Ichiro Nagano, Takasago (JP); Taiji Kikuchi, Ritto (JP); Masakatsu Fujita, Ritto (JP); Yukio Kodama, Ritto (JP); Toyoaki Yasui, Hiroshima (JP); Katsunori Akiyama, Takasago (JP); Toshiya Watanabe, Yokohama (JP); Chiaki Yasuda, Takasago (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 60 days.

(21) Appl. No.: 12/445,229

(22) PCT Filed: Feb. 5, 2008

(86) PCT No.: PCT/JP2008/052216
§ 371 (c)(1),
(2), (4) Date: Dec. 9, 2009

(87) PCT Pub. No.: WO2008/102663
PCT Pub. Date: Aug. 28, 2008

(65) Prior Publication Data
US 2010/0086370 A1 Apr. 8, 2010

(30) Foreign Application Priority Data

Feb. 22, 2007 (JP) .................................. 2007-043030

(51) Int. Cl.
*B32B 9/00* (2006.01)
(52) U.S. Cl. ....... 428/697; 51/307; 51/309; 204/192.15; 204/192.16; 407/119; 428/698; 428/701; 428/702

(58) Field of Classification Search .................... 51/307, 51/309; 428/697, 698, 699, 701, 702; 204/192, 204/192.15, 192.16; 407/119
See application file for complete search history.

(56) References Cited

U.S. PATENT DOCUMENTS 4,499,147 A * 2/1985 Enomoto et al. .............. 428/698
(Continued)

FOREIGN PATENT DOCUMENTS

JP 4-294063 A 10/1992
(Continued)

OTHER PUBLICATIONS

Notice of Result of Examination of the corresponding Vietnamese Patent Application 1-2009-00854 issued on Dec. 21, 2010. Japanese Office Action issued in Japanese Patent Application No. JP 2009-500144, on Sep. 1, 2011.

*Primary Examiner* — Archene Turner
(74) *Attorney, Agent, or Firm* — Birch, Stewart, Kolasch & Birch, LLP

(57) ABSTRACT

A surface coating film includes, a base material which is a hard material; and an oxidation-resistance coating layer containing, as a main component, a complex oxide of Li and at least Al and covering a surface of the base material. Further, a method of manufacturing a surface coated member, includes, supporting a base material which is a hard material in a hermetic container with the use of a holder arranged in the container; arranging a complex oxide forming target containing Li and at least Al, as main components, in the container; feeding oxygen into the container; and forming an oxidation-resistance coating layer that covers the base material to obtain the surface coated member by effecting electric discharge between the complex oxide forming target as an anode and the holder as a cathode.

10 Claims, 3 Drawing Sheets

U.S. PATENT DOCUMENTS

| | | | |
|---|---|---|---|
| 4,725,480 A * | 2/1988 | Gurol | 428/701 |
| 4,921,738 A * | 5/1990 | Cassidy | 428/701 |
| 5,314,334 A * | 5/1994 | Panzera et al. | 428/701 |
| 5,395,694 A * | 3/1995 | Sogabe et al. | 428/697 |
| 6,409,830 B1 * | 6/2002 | Kim et al. | 427/255.32 |
| 6,586,122 B2 * | 7/2003 | Ishikawa et al. | 428/697 |
| 7,179,526 B2 * | 2/2007 | Rosenflanz et al. | 428/702 |
| 7,939,181 B2 * | 5/2011 | Ramm et al. | 428/701 |
| 2004/0266323 A1 | 12/2004 | Oshima et al. | |
| 2007/0111032 A1 * | 5/2007 | Nagano et al. | 204/192.15 |
| 2007/0298280 A1 * | 12/2007 | Omori et al. | 51/307 |
| 2008/0318069 A1 * | 12/2008 | Coddet et al. | 428/698 |

FOREIGN PATENT DOCUMENTS

| | | |
|---|---|---|
| JP | 7-108404 A | 4/1995 |
| JP | 10-25565 A | 1/1998 |
| JP | 2002-331405 A | 11/2002 |
| JP | 2003-39207 A | 2/2003 |
| JP | 2003-321764 A | 11/2003 |
| JP | 2005-1019 A | 1/2005 |
| JP | 2005-138209 A | 6/2005 |
| JP | 2005-271133 A | 10/2005 |
| JP | 2006-175560 A | 7/2006 |
| JP | 2007-131927 A | 5/2007 |

* cited by examiner

Fig.5

Chart 1: Result for sputtering film forming test

| Marks | Nitride/Oxide target composition | Film structure | Estimated film thickness (μm) | Hardness (Hv) | Oxidation starting tempreture (°C) | Frictional coefficient | Peel-Off between Oxide layer/ Nitride layer | Peel-Off between Nitride layer/ Base layer (WC) | Judgement |
|---|---|---|---|---|---|---|---|---|---|
| Comparative Example 1 | Al0.7Zr0.2Si0.1N / Al1.6Cr0.403 | Nitrude/ Oxide | Nitride 4 Oxide 1 | (Peel-off around measuring point) | 1200 | 0.3 | × | ○ | Disapproval |
| Reference Example 1 | Al0.7Zr0.2Si0.1N / LiAlO2 | Nitrude/ Oxide | Nitride 4 Oxide 1 | 3230±380 | 1310 | 0.2 | ○ | ○ | Better |
| Reference Example 2 | Al0.7Zr0.2Si0.1N / LiAl2.3304 | Nitrude/ Oxide | Nitride 4 Oxide 1 | >3230 | 1350 | 0.23 | ○ | ○ | Better |
| Reference Example 3 | Al0.7Zr0.2Si0.1N / LiMg0.25Al1.503 | Nitrude/ Oxide | Nitride 4 Oxide 1 | (Peel-off around measuring point) | 1290 | 0.22 | △ (in part) | ○ | Approval |
| Reference Example 4 | Al0.7Zr0.2Si0.1N / LiMg0.5Al2O4 | Nitrude/ Oxide | Nitride 4 Oxide 1 | (Peel-off around measuring point) | 1270 | 0.23 | △ (in part) | ○ | Approval |
| Reference Example 5 | Al0.7Zr0.2Si0.1N / Li0.8Al0.8Si0.2O2 | Nitrude/ Oxide | Nitride 3.2 Oxide 0.8 | 2200~3000 | 1270 | 0.21 | ○ | × | Approval |
| Reference Example 6 | Al0.7Zr0.2Si0.1N / Li0.8Al0.8Si0.2O2 | Nitrude/ Oxide | Nitride 4 Oxide 1 | >3230 | 1270 | 0.21 | ○ | × | Approval |
| Reference Example 7 | Al0.7Zr0.2Si0.1N / Li0.17Mg0.05Al2.4804 | Nitrude/ Oxide | Nitride 4 Oxide 1 | >3230 | 1340 | 0.165 | ○ | ○ | Excellent |

SURFACE COATING FILM, METHOD OF MANUFACTURING THEREOF, CUTTING TOOL AND MACHINE TOOL

BACKGROUND OF THE INVENTION

1. Field of the Invention

The present invention relates to a surface coating film formed on a base material which is a hard material, direct or indirect there onto, a method of manufacturing thereof, a cutting tool and a cutting machine.

2. Description of the Related Art

These years, the consciousness as to environmental problems have been stimulated even in the technical field of cutting, and in particular, environmental adaptability with respect to lubrication oil has become a great issue. Accordingly, in order to reduce detrimental affection upon the environment, and further, in view of cost reductions, the need of a dry cutting technology which can completely eliminate the necessity of lubrication oil have been increased.

The merits as to a dry cutting process are as follows: occurrence of environmental problems caused by cutting oil or additives thereof can be eliminated, recycling can be facilitated, the costs caused by using and treating lubrication oil can be reduced, and so forth. Meanwhile since no lubrication oil is used, advantages obtained by lubrication, cooling and the like which have been obtained by the lubrication oil cannot be obtained, and severe cutting conditions are required.

A technology for forming a coating film having a high degree of hardness on a base material with the use of a process of physical vapor deposition has been developed so as to accept the dry cutting technology, that is, a TiN group coating film, a TiAlN group coating film or the like has been applied to a tool. However, since the TiN group coating film starts its oxidation at about a temperature of 500 deg. C. while the TiAlN group coating film starts its oxidation at a temperature of about 800 deg. C., there has been raised such a problem that these films cannot be applied to a tool adapted to be used at a high temperature.

Recently, a TiAlN group coating film disclosed in Patent Document 1 (Japanese Patent Laid-Open No. H10-25565) has been developed, which starts its oxidation at a high temperature in a range from about 1,000 deg. C. to 1,200 deg. C., and which can accept cutting conditions under a high temperature.

However, although the TiAlN group coating film disclosed in the Patent Document 1, can accept the cutting condition under a high temperature, it would soon peel off. Further, its oxidation-resistance is insufficient in the case of using it under a high temperature.

SUMMARY OF THE INVENTION

Accordingly, in view of the above-mentioned problems inherent to the above-mentioned technology, an object of the present invention is to provide a surface coating film having a higher degree of hardness and an excellent oxide-resistance, a method of manufacturing thereof, a cutting tool and a cutting machine.

To the end, according to the present invention, there is provided a surface coating film characterized in that an oxidation-resistance coating layer mainly composed of a complex oxide of Li and at least Al is coated over a surface of a base material which is a hard material, direct to thereto or indirect thereto through the intermediary of a highly hard coating layer.

The structure of the surface coating film containing a complex oxide, as a main component, of Li and at least Al can exhibit, in addition to a high degree of hardness and an excellent oxidation-resistance, an effect of restraining temperature rise, and as well exhibits an excellent wear-resistance since its frictional coefficient is small and its heat generation is less. Further, in the structure of the surface coating film, the base material is preferably a hard material such as cemented metal alloy or high-speed steel (also including high speed tool steel).

Further, the surface coating film according to the present invention has a high degree of hardness and an excellent oxidation-resistance, and accordingly, is preferably used as a coating film material for processing the surface of a tool or dies. Thus, it is industrially valuable. Further, in addition to the high degrees of hardness and oxidation-resistance, the surface coating film according to the present invention has an excellent wear-resistance due to high adherence, and accordingly, it is preferably used as a coating film material for a cutting tool used in a dry cutting process (that is, cutting with no use of cutting fluid).

Further, the present invention as stated above is characterized in that the oxidation-resistance coating layer made of a complex oxide formed by containing Li and other metal oxide, is coated over the surface of a highly hard coating layer formed on a base material such as the above-mentioned hard material.

Further, more preferably, the complex oxide is formed by containing Li and Al, or Li, Al and Mg or Si metal oxide.

Further, the structure of the surface coating film as stated above is characterized in that the highly hard coating layer contains, in addition to Al, Si, a nitride of at least one kind of an element selected from a group consisting of Zr, Hf, Pd, Ir and rare earth elements.

Further, the structure of the surface coating film is characterized in that the highly hard coating layer further contains, in addition to Al and Si, a nitride of at least one kind of an element which is either Cr or Ti.

Further, the structure of the surface coating film as stated above, is characterized in that the thickness A of the oxidation-resistance coating layer is not greater than the thickness B of the highly hard coating layer, that is, $A \leqq B$.

Li contained in the oxidation-resistance coating layer has a high degree of affinity with respect to the nitride contained in the highly hard coating layer, that is, it has a synthesis of a crystal structure with respect to the nitride. Thus, the adherence between the oxidation-resistance coating layer and the highly hard coating layer is increased, and accordingly, they can hardly peel off from each other.

Further, the above-mentioned structure of the surface coating film, is characterized in that an intermediate layer containing at least one of a nitride of at least one kind of an element selected from a group consisting of Al, Ti and Cr, a carbide and a carbon nitride is provided between the base material and the highly hard coating film.

With the provision of the above-mentioned intermediate layer, the adherence between the base material and the highly hard coating layer becomes higher, and accordingly, the highly hard coating layer can hardly peel off, thereby it is possible to enhance the wear-resistance of the oxidation-resistance coating layer.

Further, according to the present invention, there is provided a method of manufacturing a surface coating film comprising the steps of:

supporting a base material which is a hard material, as it is, or a highly hard coating layer coated substance in which the base material is coated over its outer surface with a highly hard coating layer in a hermetic container with the use of a holder set in the container, arranging a complex oxide forming target formed of Li and at least Al as main components in the container, feeding oxygen into the container, causing electric discharge between the target as an anode and the holder as a cathode so as to form a surface oxide-resistance coating layer on the base material or the highly hard coating layer coated substance in order to obtain the surface coating film.

With this manufacturing method, there can be formed a surface coating film having an excellent wear-resistance in addition to a high degree of hardness and an excellent oxidation-resistance.

Further, according to the present invention, there is provided a cutting tool characterized by using a surface coating film in which an oxidation-resistance coating layer composed of, as a main component, a complex oxide of Li and at least Al is coated over an outer surface of a tool base material which is either a high speed steel (or high speed tool steel) in which metal components including chromium, tungsten, molybdenum and vanadium are added to the steel that is then subjected to heat-treatment such as quenching, or cemented metal alloy which is formed by sintering a powder of hard metal carbide, or over an outer surface of a highly hard coating layer formed on the tool base material.

Thus, there can be obtained a cutting tool having a high degree of hardness, an excellent oxidation-resistance and an excellent wear-resistance.

Further, the cutting tool may be used for a machine tool for fabricating a workpiece in a dry cutting process (which is cutting with no use of cutting fluid), and may be preferably used, in particular, for a machine tool for gear cutting, in which a desired workpiece is fabricated by a gear cutting tool such as a hob cutter, a pinion cutter or a broach.

The above-mentioned cutting machine tool can be used for a cutting process which requires, for a cutting tool, a high degree of hardness, an excellent oxidation-resistance and an excellent wear-resistance, and in particular for a dry cutting process (which is a cutting process with no use of cutting fluid), and accordingly, it is excellent in view of the environmental protection and the costs.

It is noted that the above-mentioned configurations can be combined unless the concept of the present invention is departed.

As stated above, the surface coating film according to the present invention, having a high degree of hardness and an excellent oxidation-resistance, may be preferably used for a tool or dies. Further, it has a high degree of adherence with respect to the highly hard coating layer containing a nitride so as to hardly peel off, and further, it has an excellent wear-resistance, thereby it is possible to preferably use the surface coating film for a cutting tool and a cutting machine tool for a dry cutting process in which no cutting fluid is used.

Further, according to the present invention, a surface coating film having an excellent wear-resistance in addition to a high degree of hardness and an excellent oxidation-resistance can be manufactured.

In particular, according to the present invention, a high degree of hardness and an excellent oxidation-resistance can be also obtained by the physical vapor deposition, the thus obtained surface coating film can be preferably used as a cover film for surface-treating a tool and dies, and accordingly, it is industrially valuable. Further, according to the present invention, the surface coating film can have a more excellent wear-resistance due to a high degree of adherence in addition to a high degree of hardness and a high oxidation-resistance, and accordingly, it may be preferably used not only for manufacturing a tool and dies, but also for a cover film for a cutting tool for a dry cutting process (which is a cutting process with no use of cutting fluid).

In particular, it may be preferably used for a gear cutting tool such as a hob cutter, a pinion cutter or a broach.

BRIEF DESCRIPTION OF THE DRAWINGS

FIG. 5 is a view for exhibiting results of film forming tests for a comparison example and reference examples 1 to 6 among which target compositions of a high hard coating layer (nitride) and an oxidation-resistance coating layer (oxide) are changed.

DETAILED DESCRIPTION OF THE INVENTION

Explanation will be hereinbelow made of preferred embodiments of the present invention. It is noted that dimensions, materials, shapes, relative positions and the like of components explained in these embodiment should be intended to limit the technical scope of the present invention unless otherwise specifically explained, that is, they are merely used for explanation purpose.

(Embodiment 1)

Figure 1:
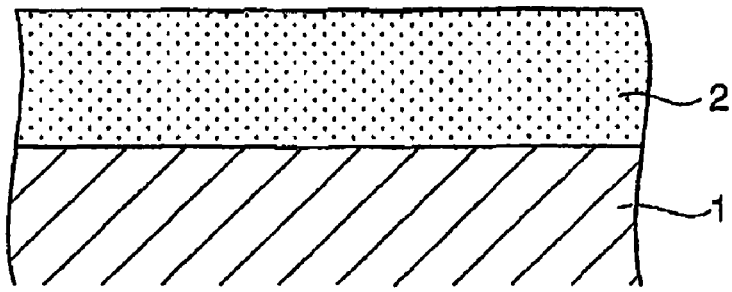
FIG. 1 is a schematic sectional view illustrating an embodiment 1 of the present invention.

Referring to FIG. 1 which is a schematic sectional view illustrating an embodiment 1 of the present invention, a surface coating film in this embodiment has a base material 1 and an oxidation-resistance coating layer 2 made of a complex oxide formed by containing Li and another metal oxide. It is noted that a hard material such as a cemented metal alloy or a high speed steel (or a high speed tool steel) is used as the base material 1.

(Embodiment 2)

Figure 2:
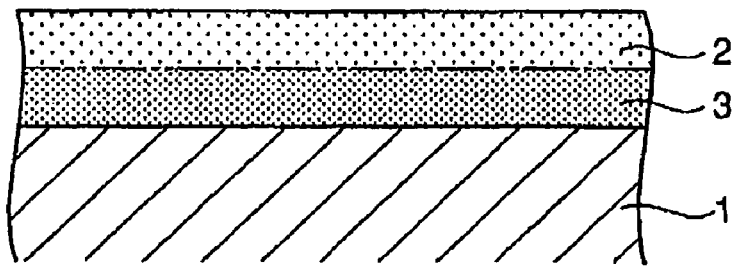
FIG. 2 is a schematic sectional view illustrating an embodiment 2 of the present invention.

Referring to FIG. 2 which is a schematic sectional view illustrating an embodiment 2 of the present invention, a surface coating film in the second embodiment, is composed of a base material 1 formed on its outer surface with a highly hard coating layer 3, and an oxidation-resistance coating layer 2 coated over the outer surface of the highly hard coating layer 3.

In this configuration, the film thickness of the oxidation coating layer 2 is preferably less than that of the high hard coating layer 3, but their thicknesses may be set to be equal to each other in view of various conditions.

(Embodiment 3)

Figure 3:
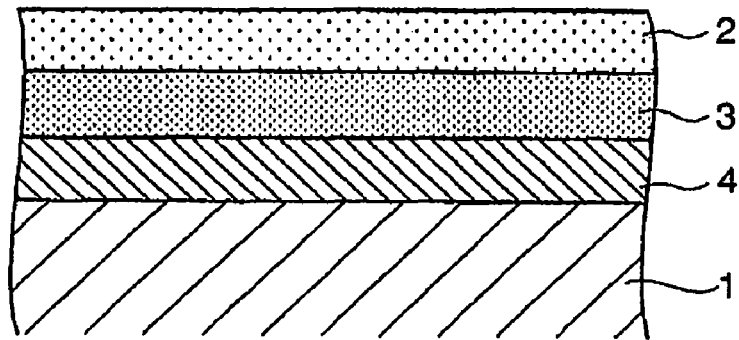
FIG. 3 is a schematic sectional view illustrating a embodiment 3 of the present invention.

Referring to FIG. 3 which is a schematic sectional view illustrating an embodiment 3 of the present invention, a surface coating film in the third embodiment, is composed of a base material 1 formed thereon with an intermediate layer 4 containing at least one of a nitride of at least one kind of an element selected from a group consisting of Al, Ti and Cr, a carbide or a carbon nitride, and a high hard coating layer 3 formed on the outer surface of the intermediate layer 4, and an oxidation-resistance coating layer 2 formed on the high hard coating layer 3.

In the embodiments 2 and 3, the highly hard coating layer 3 and the intermediate layer 4 are preferably formed with the use of a physical vapor deposition process such a high frequency sputtering or an ion plating in order to form the surface coating film having a high degree of adherence and an excellent wear-resistance.

Figure 4:
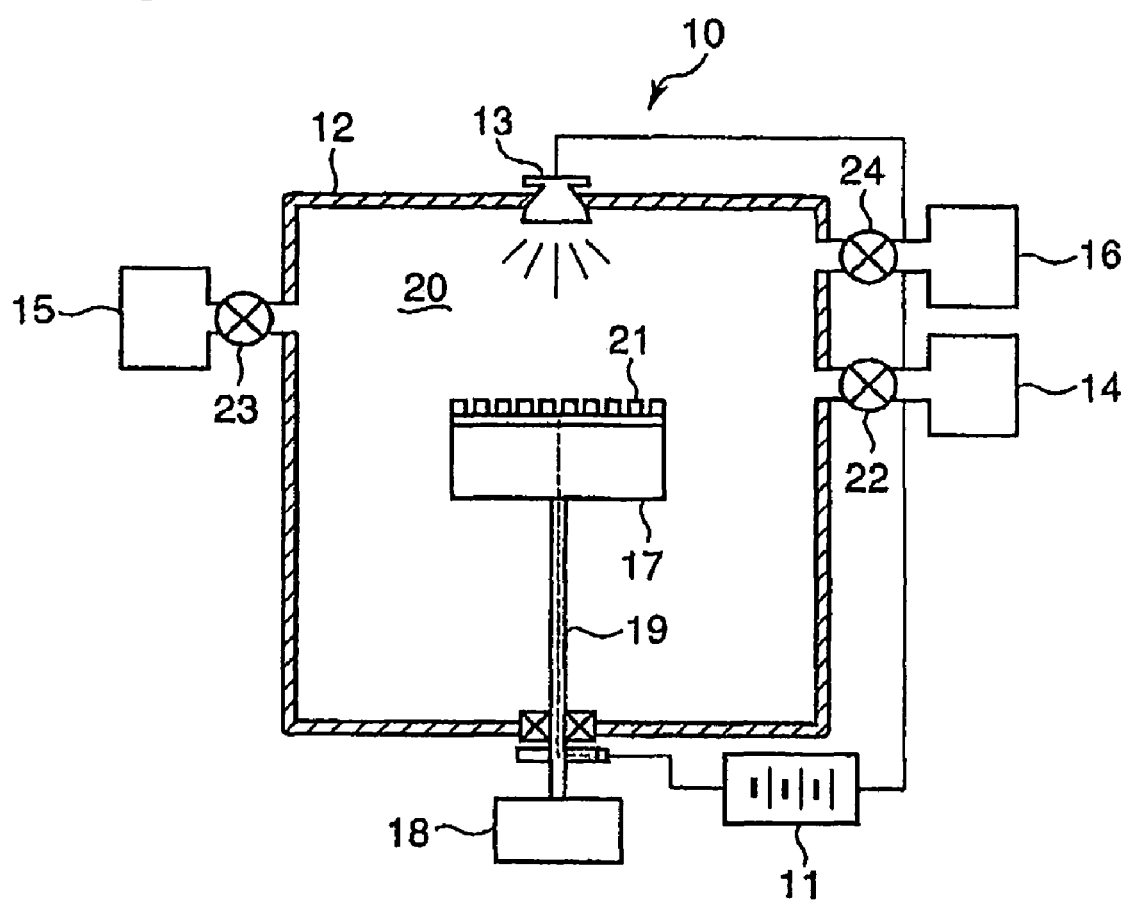
FIG. 4 is a schematic view illustrating a coating apparatus for forming an oxidation-resistance coating layer on a base material or a substance coated thereover with a high hard coating layer.

FIG. 4 is a schematic view illustrating a film forming apparatus for forming the oxidation-resistance coating layer on the base material or the highly hard coating layer coated substance coated thereover with the highly hard coating layer.

The film forming apparatus 10 is composed of a casing 12 which is hermetic against the atmospheric air, a target 13 arranged to the ceiling of the container while a table-like holder 17 is located in a chamber 20 of the casing 12. The holder 17 is coupled to a motor 18 through the intermediary of a rotary shaft 19 so that the holder 17 can be rotated in its circumferential direction. Further, a DC power source 11 is connected between the target 13 and the holder 17, the target 13 being connected to the positive (+) side of the power source 11 while the holder 17 is connected to the negative (-) side of the power source 11.

Although only one target 13 is schematically shown in FIG. 4, there may be arranged not less than two targets. In this case, the not less than two targets 13 may be located at positions which have a substantially equal distance to the holder 17.

A vacuum pump 14 is connected to the chamber 20 of the casing 12 through the intermediary of a control valve 22 in order to evacuate the chamber 20. Further, an argon gas source 15 is connected to the chamber 20 through the intermediary of a control valve 23 so as to feed an inert gas into the chamber 20. Further, an oxygen gas source 16 is connected to the chamber 20 through the intermediary of a control valve 24 in order to feed oxygen gas into the chamber 20.

In the above-mentioned embodiment, the number and kinds of targets 13 are adjusted in accordance with a kind of a layer formed on the base material or a substance 21 coated thereover with a high degree coating layer.

In the film forming apparatus 10, the base material as it is, or the highly hard coating layer substance 21 in which the high hard coating layer is formed on the surface of the base material is set on the holder 17, and the control valves 22, 23 are at first opened so as to feed an argon gas into the chamber 20 while the chamber 20 is evacuated to be vacuum.

After the completion of the vacuum evacuation, when an argon atmosphere is effected in the chamber 20, the holder 18 is rotated by the motor 18. Next, the control valves 22, 23 are closed, and a DC voltage is applied between the target 13 and the holder 17 so as to generate plasma in order to raise the temperature in the chamber 20. When the temperature in the room is settled at a constant temperature, the control valve 24 is opened in order to feed oxygen from the oxygen gas source 16 into the chamber 20 so as to cause electric discharge.

Thus, an oxidation-resistance coating layer is formed on the outer surface of the base material or the outer surface of the substance in which a base material is covered with a highly hard coating layer. Thus, a surface coating film having a high degree of hardness, and an oxidation-resistance and a wear-resistance which are excellent is obtained.

The surface coating film in this embodiment has a single layer structure in which an oxidation-resistance coating layer (oxide) is formed on a base material which is a cemented metal alloy (WC), or a multilayer structure in which an oxidation-resistance coating layer is formed on the outer surface of a highly hard coating layer (nitride) formed on the base material.

The oxidation-resistance coating layer (oxide) is adapted to be formed on the outer surface of the high hard coating layer (nitride) which is rigid, in order to improve its properties such as a friction coefficient and an oxidation starting temperature. In the case of the single layer structure, the oxidation-resistance coating layer was built up to a film thickness of about 3 µm, and in the case of the multilayer structure, the oxidation-resistance coating layer was built up to a film thickness of about 1 µm on the highly hard coating layer after the latter was built up to a film thickness of about 3.5 µm.

FIG. 5 is a view which shows test results for coatings in a comparison example and reference examples 1 to 6 among which the target compositions of the oxidation-resistance layer (oxide) and the rigid high hard coating layer (nitride) are changed.

It is noted that the nitride film was formed in such a way that a disc-like compact of a nitride material powder (having a diameter of 50 mm and a thickness of about 3 mm) was set up on a 4 inch diameter AlN target, and a high frequency sputtering process was carried out. As to the preparation composition of the compact for forming the nitride film, $Al_{0.7}Zr_{0.2}Si_{0.1}N$ which can exhibit a high degree of hardness and a high oxidation starting temperature was used.

The oxide film was formed in such a way that a disc-like compact (having a diameter of 50 mm and a thickness of about 3 mm) of an oxide material powder is set on a 4-inch diameter n $Al_2O_3$ target, and a high frequency sputtering was carried out. The base material which was used for forming the film was cemented metal alloy (WC) having dimensions of about 12 mm×12 mm×5 mm.

The nitride compact for the sputtering was produced by molding a mixture of material powders of AlN, ZrN and $Si_3N_4$ which are mixed so as to have a predetermined composition, in dies having an inner diameter of 50 mm. Similarly, the oxide compact was formed by molding a mixture of material powders of $LiAlO_2$, MgO, $Al_2O_3$, $Cr_2O_3$, $SiO_2$ and the like which were mixed so as to have a predetermined composition, in dies having an inner diameter of 50 mm. The powder of $LiAlO_2$ was synthesized by calcining material powders of $LiCO_3$ and $Al_2O_3$ at a temperature of 1,250 deg. C. for two hours.

Further, in the reference examples, the mixing ratio of Li and Al for $Li_xAl_yO_z$ was set to y/x=0.9 to 40. If y/x is not greater than 0.9, a sole $Li_2O$ layer was possibly formed, and accordingly, it is not preferable.

For example, as in the reference example 7, an oxide layer having a film composition of $Li_{2.5}Mg_{0.5}Al_{37}O_{59.7}$ was formed by a sputtering process so as to obtain a target composition, (nitride/oxide):($Al_{0.7}Zr_{0.2}Si_{0.1}N$/ $Li_{0.17}Mg_{0.05}Al_{2.804}$) in the reference example 7.

The hardness of the thus formed surface coating film was measured with the use of a micro Vickers hardness meter under a load condition of 10 g in 10 sec.

Further, the oxidation starting temperature of the surface coating film was determined in such a way that a nitride coating film formed on a Pt plate having dimensions of about 12 mm×5 mm×0.05 mm was heated in a differential thermobalance (TG-DTA) so as to analyze a temperature at which an increase in weight and heat generation that were caused by oxidation were initiated. During the TG-DTA analysis, a maximum heating temperature was 1,400 deg. C. while a temperature rising rate was 10 deg. C./min. The crystal structure of the coating film was measured by an X-ray analysis.

The testing was carried out with the use of AlZrSiN group nitride for a typical nitride layer as a lower layer. In view of results of measurements for the harnesses and the oxidation starting temperatures of the surface coating films shown in FIG. 5, it was found that the oxidation-resistance coating layers each composed of a complex oxide formed by containing an oxide of Li and the other metal, (reference examples 1 to 6) were hard to peel off in comparison with an oxide coating layer which does not contain Li (comparison example 1).

Further, in the case of reference example 6 in which Si was added, it has been found that the adherence with respect to the nitride can be enhanced while the frictional coefficient thereof is maintained substantially at a value obtained in reference example 1.

The above-mentioned effects can be similarly obtained by carrying out the oxide coating according to the present invention on a coating film of another nitride such as a nitride of Al, Cr or Si or a nitride of Al, Ti, Si, that is, a coating having a low frictional coefficient and a long service life can be obtained.

Further, the oxidation starting temperature is high, that is for example, 1,310 deg. C. in reference example 1 and 1,350 deg. C. in example 2 in comparison with 1,200 deg. C. in comparison example 1. Thus, even though it is hard to be oxidized even though the cutting temperature increases, and accordingly, the service life of a cutting tool or the like becomes longer. Moreover, the frictional coefficient is low, that is, 0.2 in reference example 1 and 0.23 in reference example 2 in comparison with 0.3 in comparison example 1, and accordingly, the heat value caused by friction can be decreased. Thus, even though the cutting speed (revolution speed) is increased, the service life of a cutting tool can become longer.

Further, in reference example 7, the oxidation starting temperature becomes higher, that is, 1,340 deg. C. Thus, oxidation can hardly occur even though the cutting temperature increases, and accordingly, the service life of the cutting tool becomes longer. Further, the friction coefficient is extremely low in comparison with 0.3 in the comparison example 1, that is, it is 0.164 which is lower than 0.2 in reference example 1. In other words, the friction coefficient in reference example 7 is not greater than ⅔ of the friction coefficient (0.3) in comparison example 1, that is, about ½. Thus, in view of such a low frictional coefficient which is comparable with that of boric oxide, there can be provided a long service life tool coating.

Thus, with the formation of the oxidation-resistance coating layer composed of the complex oxide formed by containing an oxide of Li and other metal, the oxidation starting temperature can be increased so that oxidation can hardly occur even at a high temperature, and the friction coefficient is low. Thus, it has been found that the oxidation-resistance coating layer can hardly peel off. It is noted that the same result can be obtained even though Cr, Ti, Hf, Pd, Ir and rare earth elements are used, instead of Zr in the AlZrSiN group compound which were used a typical example of the nitride layer since the lattice constant is not changed appreciably.

Industrial Applicability

According to the present invention, there can be provided a surface coating layer having a high degree of hardness, an excellent oxidation-resistance, and as well having an excellent wear-resistance, and a method of manufacturing thereof. The surface coating film can be also used for a cutting tool or a cutting machine with the use of its property.

The invention claimed is:

1. A surface coating film, comprising:
   a base material made of cemented metal alloy or high-speed steel or high-speed tool steel;
   an oxidation-resistance coating layer containing, as a main component, a complex oxide of Li and at least Al; and
   a highly hard coating layer containing nitride,
   wherein the highly hard coating layer is provided between the surface of the base material and the oxidation-resistance coating layer, thereby making a coating layer of the base material a multilayer structure including the oxidation-resistance coating layer and the highly hard coating layer, and
   wherein the oxidation-resistance coating layer forms a metal oxide of Li and Al alone, or a metal oxide of Li, Al, and Mg or Si, and a mixing ratio of Li and Al for $Li_xAl_yO_z$ is set to y/x=0.9 to 40.

2. A surface coating film as set forth in claim 1, wherein the highly hard coating layer contains a nitride of Al, Si and at least one element selected from a group consisting of Zr, Hf, Pd, Ir and rare earth elements.

3. A surface coating film as set forth in claim 2, wherein the oxidation-resistance coating layer has a thickness A while the highly hard coating film containing nitride has a thickness B, the thickness A being not greater than the thickness B.

4. A surface coating film as set forth in claim 1, further comprising:
   an intermediate layer interposed between the base material and the highly hard coating layer containing nitride, and containing at least one of a nitride, carbide, and carbon nitride of at least one element selected from a group consisting of Al, Ti, and Cr.

5. A surface coating film as set forth in claim 1, wherein the highly hard coating layer contains a nitride of Al, Si and at least one element selected from Cr and Ti.

6. A method of manufacturing a surface coated member, comprising:
   manufacturing the surface coated member, as set forth in claim 1 by,
   supporting a base material made of cemented metal alloy or high-speed steel or high-speed tool steel in a hermetic container with the use of a holder arranged in the container;
   arranging a complex oxide forming target containing Li and at least Al, as main components, in the container;
   feeding oxygen into the container; and
   forming an oxidation-resistance coating layer that covers the base material to obtain the surface coated member by effecting electric discharge between the complex oxide forming target as an anode and the holder as a cathode.

7. A method of manufacturing a surface coated member according to claim 6,
   wherein a highly hard coating layer containing nitride is formed on the base material, and
   wherein in the step of forming the oxidation-resistance coating layer, the oxidation-resistance coating layer is formed on the highly hard coating layer.

8. A cutting tool, comprising:
   a tool base material being one of,
      high speed steel or high speed tool steel obtained by adding components including chromium, tungsten, molybdenum, and vanadium to steel and them subjecting the steel to heat-treatment, and
      cemented metal alloy obtained by sintering powder of hard metal carbide;
   an oxidation-resistance coating layer containing, as a main component, a complex oxide of Li and at least Al; and
   a highly hard coating layer containing nitride,
   wherein the highly hard coating layer is formed on the tool base material, and the oxidation-resistance coating layer is formed on the highly hard coating layer, thereby making a coating layer of the base material a multilayer structure including the oxidation-resistance coating layer and the highly hard coating layer,
   wherein the oxidation-resistance coating layer forms a metal oxide of Li and Al alone, or a metal oxide of Li, Al, and Mg or Si, and a mixing ratio of Li and Al for $Li_x Al_y O_z$ is set to y/x=0.9 to 40.

9. A machine tool, comprising:
a cutting tool as set forth in claim 8, and wherein
a workpiece is fabricated by means of the cutting tool in a dry cutting process that is a process of cutting with no use of cutting fluid.

10. A tooth cutting machine tool, comprising:
a cutting tool as set forth in claim 8 as one of a hob cutter, a pinion cutter and a broach, wherein
a workpiece is fabricated by means of the cutting tool.

* * * * *